US007755927B2

(12) United States Patent
Barasinski et al.

(10) Patent No.: US 7,755,927 B2
(45) Date of Patent: Jul. 13, 2010

(54) MEMORY DEVICE OF SRAM TYPE

(75) Inventors: Sébastien Barasinski, Meylan (FR); François Jacquet, Froges (FR); Marc Sabut, Eybens (FR)

(73) Assignee: STMicroelectronics S.A., Montrouge (FR)

( * ) Notice: Subject to any disclaimer, the term of this patent is extended or adjusted under 35 U.S.C. 154(b) by 14 days.

(21) Appl. No.: 11/951,001

(22) Filed: Dec. 5, 2007

(65) Prior Publication Data

US 2008/0144413 A1    Jun. 19, 2008

(30) Foreign Application Priority Data

Dec. 14, 2006    (FR) .................................. 06 10939

(51) Int. Cl.
G11C 11/00    (2006.01)
(52) U.S. Cl. ........................ 365/154; 365/155; 365/156; 365/203; 365/189.11
(58) Field of Classification Search ................. 365/154, 365/203, 189.11, 155, 156
See application file for complete search history.

(56) References Cited

U.S. PATENT DOCUMENTS

| 5,652,727 | A | | 7/1997 | Tanaka et al. | |
|---|---|---|---|---|---|
| 5,732,015 | A | * | 3/1998 | Kazerounian et al. | 365/154 |
| 6,108,257 | A | | 8/2000 | Davies | |
| 6,496,399 | B1 | * | 12/2002 | Choi et al. | 365/49.17 |
| 6,552,941 | B2 | * | 4/2003 | Wong et al. | 365/201 |
| 7,355,906 | B2 | * | 4/2008 | Joshi et al. | 365/189.11 |
| 7,436,696 | B2 | * | 10/2008 | Wang et al. | 365/154 |
| 7,453,756 | B2 | * | 11/2008 | Moyer et al. | 365/226 |
| 7,542,329 | B2 | * | 6/2009 | Cheng et al. | 365/154 |
| 2005/0174864 | A1 | | 8/2005 | Jang et al. | |

OTHER PUBLICATIONS

Romanovsky, et al., "Leakage Reduction techniques in a 0.13um SRAM Cell," VLSI Design, Proceedings, 17th International Conference on Mumbai, India Jan. 5-9, 2004, Los Alamitos, CA, USA; IEEE Computer Society, US, pp. 215-221; XP010679002; ISBN: 0-7695-2072-3.
Preliminary French Search Report and Written Opinion, FR 06 10969, dated Apr. 19, 2007.

* cited by examiner

Primary Examiner—Pho Miner Luu
(74) Attorney, Agent, or Firm—Gardere Wynne Sewell LLP

(57) ABSTRACT

A memory device of SRAM type has a memory plan constituted by base memory cells organized in lines and in columns. Each cell of a column is connected between two bit lines which are precharged during a reading operation. Circuitry is provided for generating a precharge voltage of the bit lines which is less than a nominal supply voltage of the device.

23 Claims, 3 Drawing Sheets

MEMORY DEVICE OF SRAM TYPE

PRIORITY CLAIM

This application is a translation of and claims priority from French Application for Patent No. 06 10939 of the same title filed Dec. 14, 2006, the disclosure of which is hereby incorporated by reference.

BACKGROUND OF THE INVENTION

1. Technical Field of the Invention

The present invention relates to memories in integrated circuits of the SRAM type and, more particularly, to reading memory cells of the above type.

2. Description of Related Art

FIG. 1 schematically illustrates a memory plan MEM, which conventionally comprises word lines WLi and columns COLj, wherein each column includes two bit lines BLT and BLF.

The memory cells of such a memory plan, illustrated in detail in FIG. 2, are connected differentially between two bit lines BLT and BLF of each column of the memory plan and can be activated by a word line WLi. Further, reading amplifiers (sense amplifiers) SA are placed at the foot (end) of the columns of the memory plan and are classically activated by an activation signal Act (sense amp enable).

A base memory cell CELL of the memory plan is illustrated in FIG. 2. It comprises a locking (latch) circuit formed by a first inverter IA and a second inverter IB cross-connected between a first node A and a second node B. Each inverter thus has its output connected to the input of the other inverter. A first access transistor TA is provided, whereof a drain is connected to the node A, whereof a gate is connected to a word line WL of the memory plan and whereof a source is connected to a first bit line BLT. A second access transistor TB is likewise provided whereof a drain is connected to the node B, whereof a gate is connected to a word line WL and whereof a source is connected to the second bit line BLF of the column of the memory cell.

A reading operation of such a memory cell usually comprises a precharge phase of the bit lines to which the memory cell is connected.

More precisely, during the precharge phase, the two bit lines BLT and BLF are first precharged to a reading potential corresponding classically to the nominal supply voltage Vdd of the device and the corresponding word line WL is then subjected to the potential Vdd (WL=1 logic) to select the memory cell in reading. Then, the two bit lines BLT and BLF are made floating. Since the word line WL is at the high potential Vdd, the n-channel access transistors TA and TB of the cell are thus made in the on-state.

In an example where the node A of the memory cell selected in reading is at logic 0 and where the node B is thus at logic 1, with the line BLT being precharged at the potential Vdd, the two sides of the channel of the access transistor TA are at different potentials, such that a current Iread circulates through this channel. This current Iread will discharge the line BLT and thus progressively bring its potential to 0 volts (logic 0). However, as the node B of the memory cell and the bit line BLF are at the same potential Vdd, the two sides of the channel of the transistor TB0 are at the same potential and no current circulates in this channel. The line BLF is thus supposed to remain in its high state of precharge, i.e. at potential Vdd.

After a certain period, the amplifier SA detects a difference in potential between the lines BLT and BLF, which, when greater than the input offset voltage of the amplifier, produces a data signal at the output of the amplifier corresponding to the data stored in the memory cell controlled in reading.

Associated classically with such a reading operation performed on a memory cell is an operating margin, known as the Static Noise Margin (SNM). In the same way, an operating margin, known as the Write Margin, is linked to an operation for writing a memory cell. These margins, for reading or writing, reflect the capacity of a memory cell to be read or written without being perturbed. They are antagonists, meaning to the extent where improvement made to one is done to the detriment of the other.

Currently all circuits are focusing on lowering the size of memories. And yet, the drop in the size of the components causes substantial electrical variability of transistors, which negatively influences the margins for reading and writing of a memory cell by augmenting their dispersion. This degradation phenomenon of the margins for reading and writing is further accentuated by the decrease in supply voltages used in the circuits. In other words, novel technologies are employed, which concomitantly aim for an increasingly smaller circuit size and the use of increasingly lower supply voltages, make reading and writing operations increasingly difficult by lowering the available margins.

So, with low margins, at the moment of reading a memory cell, when the word line is activated to select the memory cell in reading, the locking circuit of the memory cell holding the data can be perturbed by the precharge voltage of the bit lines BLT and BLF, which typically correspond to the nominal supply voltage Vdd.

In reference to FIG. 3, illustrating the value of the margin at the SNM reading as a function of the precharge voltage of the bit lines VBL, it is evident that precharge of the bit lines at the supply voltage Vdd, for example 1.2 volts, does not produce an optimal margin value at the reading.

Even though correct for the majority of the memory cells of the memory plan, the SNM margin value corresponding to a precharge at Vdd of the bit lines can, however, prove inadequate to ensure reading without perturbation of the most restricting cells of the memory plan (especially those having local deviations—such as mismatch or non-matching).

There is a need to eliminate these drawbacks by proposing a memory device of SRAM type, in which the SNM parameter defining the margin at reading a memory cell is improved, such that reading a memory cell is favored.

SUMMARY OF THE INVENTION

With this objective in mind, in an embodiment, a memory device of SRAM type comprises a memory plan constituted by base memory cells organized in lines and in columns. Each cell of a column is connected between two bit lines designed to be precharged during a reading operation of the cell. Means are provided for generating a precharge voltage of the bit lines which is less than a nominal supply voltage of said device.

The precharge voltage thus generated is advantageously adapted to improve the margin at reading.

The means for generating the precharge voltage of the bit lines preferably comprise means for adjusting the precharge voltage of the bit lines generated over a range of values between a first voltage value and a second voltage value, greater than said first value, each of such values being less than the nominal supply voltage, and in particular less than Vdd.

Advantageously, the first voltage value is selected such that the margin at reading is optimal, while the second voltage value corresponds to a value for which the margin at reading is not optimal, although it is improved.

According to an embodiment, the means for generating the precharge voltage of the bit lines comprise at least one modified memory cell of the SRAM type which is constituted by two access transistors and two inverters cross-connected between first and second internal nodes of the cell. The nodes are short-circuited. Each inverter comprises a transistor nMos, connected between said internal short-circuited nodes and a supply line of the transistors nMos, and a transistor pMos, connected between said internal short-circuited node and a supply line of the transistors pMos.

Advantageously, the means for generating the precharge voltage of the bit lines comprise a plurality of such modified memory cells placed in parallel. In this way, the time to set up the precharge voltage of the bit lines is improved.

The means for generating the precharge voltage of the bit lines preferably comprise a matrix of modified memory cells, organized in lines and in columns, a supply line of the transistors nMos being distributed along each line of the matrix and a supply line of the transistors pMos being distributed along each column of the matrix.

According to an embodiment, the means for adjusting the precharge voltage of the bit lines comprise programming means of a ratio between the number of active transistors pMos of the plurality of modified memory cells and the number of active transistors nMos of said plurality of cells.

Advantageously, the programming means comprise control means for respectively allocating to each supply line transistors nMos of the plurality of modified memory cells and to each supply line of the transistors pMos of said plurality of cells, a polarizing voltage taken between a ground voltage and the nominal supply voltage of the device.

The ratio between the number of active transistors pMos of the plurality of modified memory cells and the number of active transistors nMos of said plurality of cells is advantageously defined in such a way that a security margin is taken relative to the voltage value for which the operating margin is optimal.

In an embodiment, a process for reading a memory cell connected between two bit lines of a column of a memory plan of a memory of SRAM type comprises: a precharge stage of the two bit lines prior to a reading operation of the cell memory. The precharge stage comprises the application of a precharge voltage of the bit lines less than a nominal supply voltage of the memory.

The value of the precharge voltage applied to the bit lines is preferably previously adjusted over a range of values between a first voltage value and a second voltage value, greater than said first value.

Advantageously, the adjustment of the value of the precharge voltage of the bit lines is programmable.

BRIEF DESCRIPTION OF THE DRAWINGS

Other characteristics and advantages of the present invention will emerge more clearly from the following description given by way of illustrative and non-limiting example and in reference to the attached figures, in which.

DETAILED DESCRIPTION OF THE DRAWINGS

Figure 3:
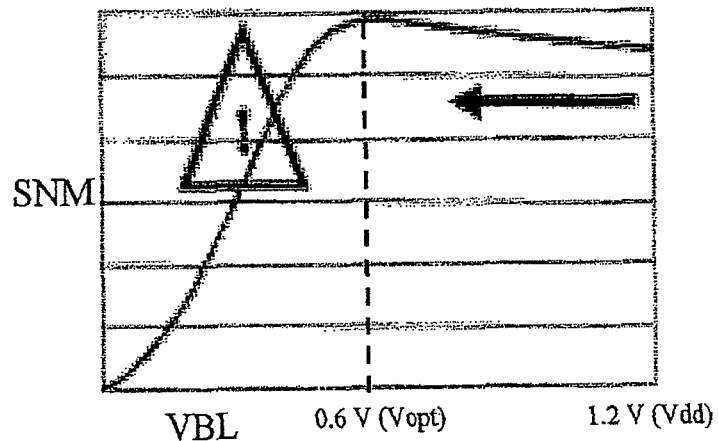
FIG. 3, already described, is a sketch illustrating the variation of the parameter SNM as a function of the precharge voltage of the bit lines.

Still with reference to FIG. 3, it is evident that the precharge voltage of the bit lines VBL would in fact have to be lessened to a value Vopt, less than the value of the nominal supply voltage Vdd, for example around 0.6 volt, to reach an optimal margin value SNM, that is, the highest, and accordingly best benefit the reading operation.

However, an excessive drop in the precharge voltage of the bit lines VBL for the purpose of optimizing the margin at the reading SNM can prove to be risky and cause the inverse effect to that desired.

In fact, as shown in FIG. 3, the margin at the reading SNM degrades sharply when the precharge voltage of the bit lines is less than the value Vopt for which the margin is optimal. The dangerous zone corresponding to the range of values of precharge voltage of the lesser bit lines Vopt is symbolized by the exclamation point in FIG. 3.

In accordance with an embodiment, an appropriate precharge voltage of the bit lines is generated, simultaneously improving the margin at reading, typically by generating a precharge voltage lower than the nominal supply voltage Vdd, while avoiding the predefined dangerous zone.

This specific precharge voltage is generated according to one embodiment by means of at least one memory cell modified to generate a decreased precharge voltage of the bit lines relative to the nominal supply voltage Vdd.

Figure 1:
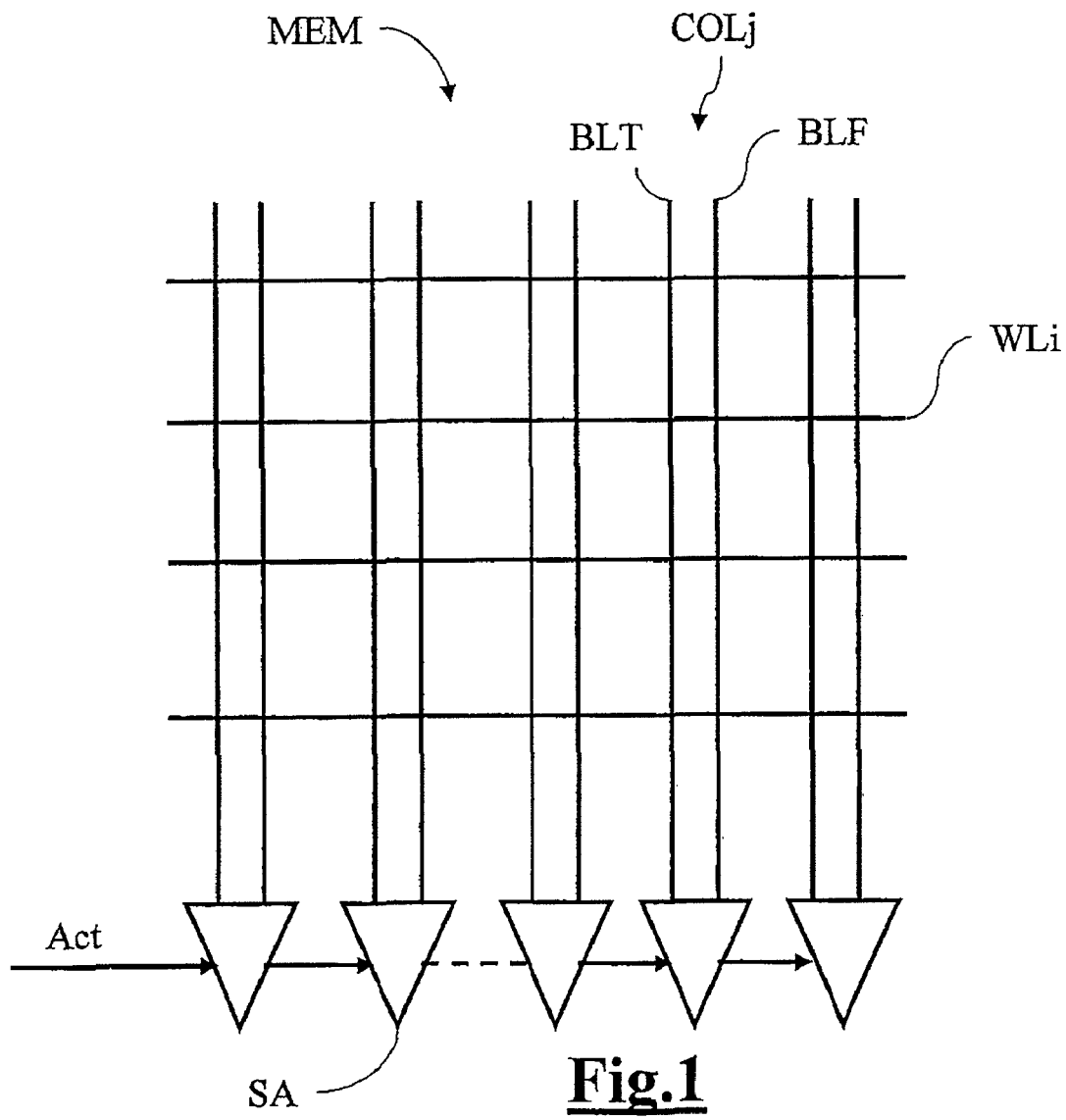
FIG. 1, already described, schematically illustrates a memory plan of SRAM type.
Figure 2:
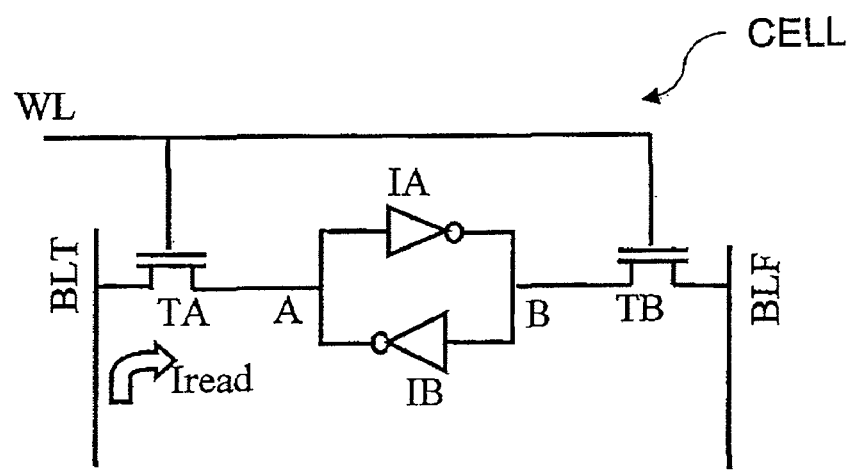
FIG. 2, already described, is a sketch of a known memory cell SRAM.
Figure 4:
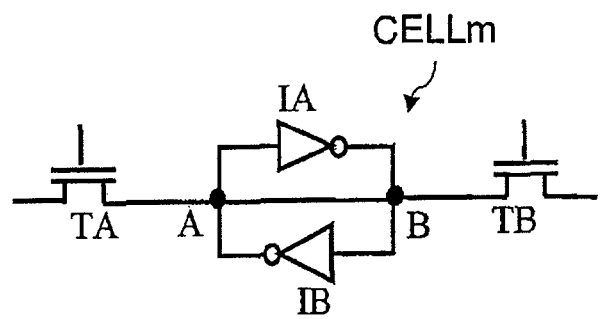
FIG. 4 is a sketch illustrating a memory cell modified according to an embodiment used for generating a specific precharge voltage of the bit lines.

FIG. 4 illustrates a memory cell modified for this purpose. The modified memory cell CELLm according to this embodiment is based on a structure similar to that described in reference to FIG. 2. It comprises two access transistors, respectively TA and TB, and a locking (latch) circuit, formed from two inverters IA and IB cross-connected between a first internal node A and a second internal node B of the cell, the two nodes A and B being short-circuited.

Since the inputs and outputs of the locking circuit of the memory cell are thus short-circuited, they provide a certain intermediate voltage relative to the supply voltage Vdd of the cell, to be utilized as precharge voltage destined for the bit lines of the memory plan.

It should also be noted that such a memory modified cell forming a precharge circuit is identical at any point to a memory cell of the memory plan from a point of view of designing manufacturing masks, thus allowing advantageously adaptation to any variation in production process.

To obtain an acceptable setup speed of the precharge voltage on the bit lines, a plurality of these memory cells thus modified will in fact be used in parallel to augment the capacity to deliver current. The short-circuited inputs and outputs of the locking circuits of the modified cells used in parallel are connected together to provide the desired precharge voltage for the bit lines of the memory plan. The number of memory cells used according to the invention in light of generation of the precharge voltage of the bit lines of the memory plan will thus depend, apart from the size of the memory, on the desired setup speed of the precharge voltage on the bit lines.

The plurality of modified memory cells CELLm, used in parallel for generating the precharge voltage of the bit lines is advantageously integrated into the memory device. They can, for example, be integrated into the memory plan itself. These cells can likewise be integrated at the level of a reference path (a dummy path) of the memory, provided to deliver the activation signal from the reading amplifiers placed at the foot of the columns of the memory plan.

It is clear that improving the value of the margin at reading by offsetting the precharge voltage VBL of the bit lines to a value Vopt, for which the margin is optimal, is perilous. In fact, the optimal margin value is obtained for a value Vopt of the precharge voltage of the bit lines located very near a danger zone corresponding to a range of voltage values for which the margin value is strongly degraded (see, FIG. 3).

Also, for security reasons, the precharge voltage of the bit lines should not be offset to a value too near the value Vopt for which the margin at reading obtained is optimal.

To this end, an embodiment provides means for adjusting the precharge voltage of the bit lines generated, such that the provided voltage value is at a level for effectively improving the margin parameter at reading, without however being too close to the voltage value Vopt for which the margin at reading is optimal. In this way, the reading operation benefits, also by avoiding the risk of leaning in the danger zone where the operation would be compromised. The programmable adjustment principle of the value of the generated precharge voltage will be described hereinbelow.

Figure 5:
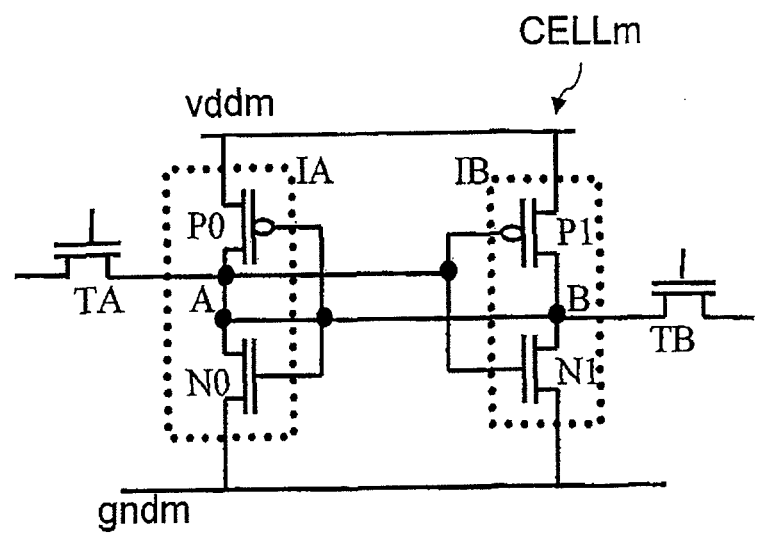
FIG. 5 illustrates in greater detail the structure of the memory cell of FIG. 4.

First, FIG. 5 illustrates in greater detail the structure of the memory cell CELLm modified according to the invention described in FIG. 4. The latter is thus a cell of SRAM type, constituted more precisely by 6 transistors, including the two access transistors TA and TB of the cell and the four storage transistors forming the locking (latch) circuit, respectively N0, N1, P0 and P1. Each of the two inverters IA and IB of the locking circuit is in fact constituted by a transistor nMos, respectively N0 and N1, connected respectively between the node A and the node B and a first supply line gndm, and a transistor pMos, respectively P0 and P1, connected between respectively the node A and the node B and a second supply line vddm. The internal nodes A and B of this cell are short-circuited so as to supply the precharge voltage of the bit lines of the memory plan.

The two transistors pMos P0 and P1 are called high excursion transistors (pull-up transistors, to the extent where they lead the cell memory to the high logic state and the two transistors nMos N0 and N1 are called low excursion transistors (pull-down transistors), to the extent where they lead the memory cell to the low logic state.

The two pull-down transistors nMos N0 and N1 of the locking circuit classically have their source connected to the ground gnd by means of the supply line of the nMos gndm, while the two pull-up transistors pMos P0 and P1 of the locking circuit classically have their source connected to the supply voltage vdd by means of the supply line of the pMos vddm.

With reference now in greater detail to the adjustment principle of the precharge voltage of the bit lines explained earlier, according to which this voltage must be able to be brought towards a value Vopt for which the margin at reading is optimal, without however being too close to this value so as to not risk leaning towards a range of values of the precharge voltage for which the margin at reading would be too degraded.

Figure 6:
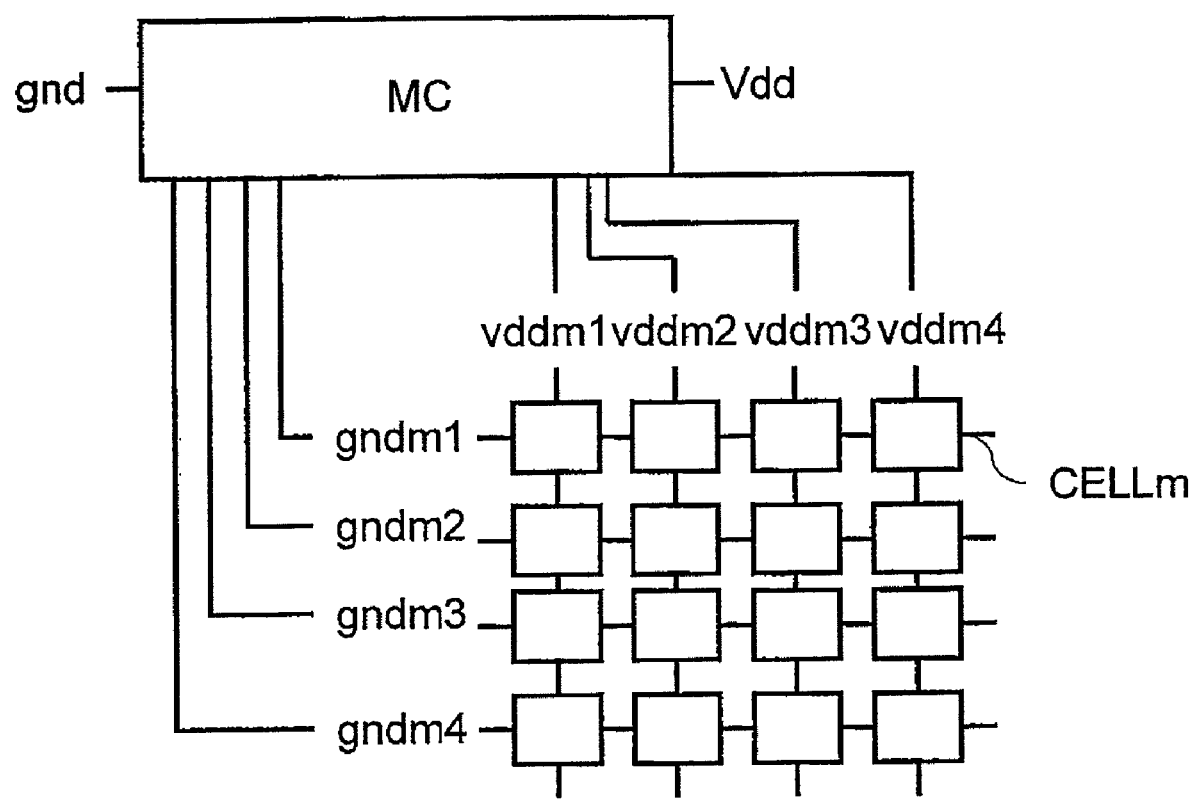
FIG. 6 schematically illustrates an example of implementation of the programming means of the generation of a precharge voltage of the bit lines according to an embodiment.

For this purpose, FIG. 6 shows an example of means for generating such a precharge voltage which is made up of a matrix of four by four modified memory cells CELLm of the type described in reference to FIGS. 4 and 5, organized in lines and in columns. These cells are placed in parallel by sharing the supply lines of the nMos and pMos of the cells on the same internal nodes, specifically the sources of the pull-down transistors nMos and pull-up transistors pMos of the cells.

Accordingly, four supply lines of the type of the supply line of the nMos gndm, respectively gndm1 to gndm4, are distributed along the lines of cells of the matrix and four supply lines of the type of the supply line of the pMos vddm, respectively vddm1 to vddm4, are distributed along the columns of cells of the matrix.

So as to benefit reading operations of the cells of the memory plan by improving the margin at reading, all the memory cells of the matrix are provided to supply to a common node combining the short-circuited inputs and outputs of all the cells, an intermediate voltage value, used as precharge voltage of the bit lines of the memory plan, substantially equal to the voltage value Vopt for which the margin at reading is optimal.

This intermediate voltage value results from the equilibrium of the charges at the level of the common node between the pull-up transistors pulling the common node towards the nominal supply voltage vdd and the pull-down transistors pulling the node common towards the ground gnd.

To reach the objective of retaining a certain security with respect to the obtained margin value at the reading, it is thus necessary to precharge the bit lines to a precharge voltage value not too close to the value Vopt for which the margin at reading is optimal.

Specific means are thus provided, which will advantageously adjust the value of the precharge voltage generated over a range of values between the voltage value Vopt, for which the margin at reading is optimal and the value of nominal supply voltage Vdd, for which the margin at reading is not improved.

More precisely, these means for adjusting the precharge voltage of the bit lines over the above range comprise programming means of a PU/PD ratio, defining the ratio between the number of active pull-up transistors in the matrix of short-circuited memory cells and the number of active pull-down transistors in this matrix.

When this programmable ratio is 1, the voltage value supplied corresponds normally to the voltage value Vopt, for which the margin at reading is optimal.

Yet so as not to be too close to this voltage value Vopt, a PU/PD ratio greater than 1 must be programmed. In this way, the number of active pull-up transistors in the matrix is greater than the number of active pull-down transistors, the consequence of which is that the precharge voltage of the bit lines generated by the matrix is offset from Vopt towards the nominal supply voltage Vdd by a magnitude depending on the programmed PU/PD ratio, thus supplying the desired security margin vis-à-vis the voltage value Vopt which is preferably avoided.

In reference to the example of FIG. 6, the PU/PD ratio is programmable by means of control means MC for polarization of the supply lines of the pull-down transistors, respectively gndm1 to gndm4, and of the supply lines of the pull-up transistors, respectively vddm1 to vddm4.

In fact, the supply lines of the pull-down transistors gndm1 to gndm4 are normally connected to the ground gnd, while the supply lines of the pull-up transistors vddm1 to vddm4 are normally connected to the nominal supply voltage of the device Vdd. In this normal configuration, all the pull-up transistors of the cells of the matrix and all the pull-down transistors of the cells of the matrix are thus active, programming a PU/PD ratio equal to 1.

To modify the programming of the PU/PD ratio, normal polarization of the supply lines of the pull-up transistors and pull-down transistors of the cells of the matrix is modified by means of the control means MC. To do this, the control means allocate to each supply line of the cells of the matrix gndm1 to gndm4 and vddm1 to vddm4 a polarizing voltage taken between the ground gnd and the nominal supply voltage Vdd of the device.

By way of example, the supply line of the pull-down transistors gndm1 is kept connected to gnd while the three other supply lines of the pull-down transistors of the matrix are connected to Vdd. Therefore, in such a configuration, only the pull-down transistors of the four cells forming the first line of the matrix remain active, the pull-down transistors of the cells forming the three other lines of the matrix are inactive.

Also, the three supply lines of the pull-up transistors vddm1 to vddm3 are kept connected to Vdd, while the supply line vddm4 is connected to the ground. In this polarization configuration of the supply lines vddm1 to vddm4 of the pull-up transistors of the cells of the matrix, the pull-up transistors of the cells forming the first three columns of the matrix are active, while the pull-up transistors of the cells forming the fourth column of the matrix are inactive.

According to this example, a PU/PD ratio equal to three is obtained. In fact, the pull-up transistors are active in twelve memory cells of the matrix, whereas the pull-down transistors are active in four cells of the matrix. Such programming offsets towards Vdd from Vopt the voltage supplied at the level of the short-circuited outputs of the cells of the matrix, before being used as precharge voltage of the bit lines of the memory plan for a reading operation.

The ratio thus programmed generates a precharge voltage of the bit lines at a value for which the margin at reading is not at its optimal value, but is nevertheless improved.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A memory device of the SRAM type, comprising:
a memory plan constituted by base memory cells of the SRAM type organized in lines and in columns, each cell of a column being connected between two bit lines intended to be precharged during a reading operation; and
a circuit adapted to generate a precharge voltage for application to the bit lines which is less than a nominal supply voltage of said memory device, the circuit adapted to generate the precharge voltage of the bit lines comprising:
a plurality of memory cells of the SRAM type forming a matrix organized in lines and in columns, each memory cell of the matrix being connected between the bit lines and having two internal complementary latch nodes which have been short-circuited together.

2. The device as claimed in claim 1, wherein the circuit adapted to generate the precharge voltage of the bit lines controls generation of the precharge voltage over a range of values between a first voltage value above one-half the nominal supply voltage and a second voltage value which is greater than said first value and less than the nominal supply voltage.

3. The device of as claimed in claim 2, wherein the circuit adapted to generate further assigns a reference voltage, comprising one of a ground voltage and the nominal supply voltage of the device, selectively to the memory cells in the matrix.

4. The device of as claimed in claim 2, wherein the circuit adapted to generate further selectively activates a pull-up function within certain ones of the memory cells in the matrix.

5. The device of as claimed in claim 2, wherein the circuit adapted to generate further selectively activates a pull-down function within certain ones of the memory cells in the matrix.

6. A memory device of the SRAM type, comprising:
a memory plan constituted by base memory cells of the SRAM type organized in lines and in columns, each cell of a column being connected between two bit lines intended to be precharged during a reading operation; and
a circuit adapted to generate a precharge voltage of the bit lines which is less than a nominal supply voltage of said device, the circuit adapted to generate the precharge voltage of the bit lines comprising:
a plurality of modified memory cells of the SRAM type forming a matrix organized in lines and in columns, each modified memory cell being connected between the bit lines;
wherein each modified memory cell of the matrix is constituted by two access transistors and two inverters cross-connected between first and second internal nodes of the cell, said internal nodes being short-circuited, each inverter comprising an nMOS transistor, connected between said internal short-circuited nodes and a supply line of the nMOS transistors, and a pMOS transistor connected between said internal short-circuited nodes and a supply line of the pMOS transistors, the supply line of the nMOS transistors being distributed along each line of the matrix and the supply line of the pMOS transistors being distributed along each column of the matrix.

7. The device as claimed in claim 6, further comprising an adjustment circuit adapted to adjust a value of the precharge voltage of the bit lines comprising a programming circuit adapted to program a ratio, in the matrix, between a number of pMOS transistors of the plurality of modified memory cells which are controlled to be active and a number of nMOS transistors of said plurality of modified memory cells which are controlled to be active.

8. The device as claimed in claim 7, wherein the programming circuit comprises a control circuit adapted to assign a reference voltage, comprising one of a ground voltage and the nominal supply voltage of the device, selectively to each supply line of the nMOS transistors of the plurality of modified memory cells and to each supply line of the pMOS transistors of said plurality of cells.

9. A memory device of the SRAM type, comprising:
an SRAM memory array including a plurality of SRAM memory cells organized in lines and columns, each memory cell having first and second output nodes connected to two bit lines and further having two internal complementary latch nodes, the SRAM memory array receiving a nominal supply voltage; and
a precharge voltage generator comprising:
a plurality of modified SRAM memory cells organized in a matrix, each modified memory cell having first and second output nodes connected to two bit lines and further having two internal complementary latch nodes which are short-circuited together; and
a control circuit adapted to control activation of the modified SRAM memory cells in the matrix so as to control generation of a precharge voltage which is less than the nominal supply voltage.

10. The memory device of claim 9 wherein each modified memory cell further includes a pull-up voltage node and a pull-down voltage node, the control circuit adapted to selectively apply the nominal supply voltage to the pull-down voltage node of selected ones of the modified memory cells in the matrix so as to shift a value of the precharge voltage away from one-half the nominal supply voltage.

11. The memory device of claim 9, wherein each modified memory cell further includes a pull-up voltage node and a pull-down voltage node, the control circuit adapted to selectively apply a ground supply voltage to the pull-up voltage node of selected ones of the modified memory cells in the matrix so as to shift a value of the precharge voltage away from one-half the nominal supply voltage.

12. The memory device of claim 9, wherein the control circuit is adapted to control generation of the precharge voltage over a range of values between a first voltage value which is above one-half the nominal supply voltage and a second voltage value which is greater than said first value and less than the nominal supply voltage.

13. The memory device of claim 9, wherein each modified memory cell further includes a pull-up transistor and a pull-down transistor, the control circuit adapted to program a ratio, in the matrix, between a number of pull-up transistors in the plurality of modified memory cells which are controlled to be active and a number of pull-down transistors of said plurality of modified memory cells which are controlled to be active.

14. The memory device of claim 9, wherein each modified memory cell further includes a pull-up voltage node and a pull-down voltage node, the control circuit adapted to selectively assign a ground voltage to certain ones of the pull-up voltage nodes so as to shift a value of the precharge voltage away from one-half the nominal supply voltage.

15. The memory device of claim 9, wherein each modified memory cell further includes a pull-up voltage node and a pull-down voltage node, the control circuit adapted to selectively assign the nominal supply voltage to certain ones of the pull-down voltage nodes so as to shift a value of the precharge voltage away from one-half the nominal supply voltage.

16. A memory device of the SRAM type, comprising:
a memory array comprising a plurality of SRAM memory cells organized in lines and in columns, each cell of a column being connected between two bit lines; and
a precharge voltage generator connected between the bit lines and which operates to generate a precharge voltage which is less than a nominal supply voltage applied to said memory array, the precharge voltage generator comprising:
a plurality of modified SRAM memory cells having internal complementary latch nodes which are short-circuited together, the modified memory cells being connected between the bit lines, and
a circuit adapted to control selective connection of power supply nodes of the modified SRAM memory cells to the nominal supply voltage and to a ground voltage.

17. The device of claim 16 wherein the circuit adapted to control selective connection comprises: a control circuit adapted to selectively apply the ground voltage to a pull-up voltage node of certain selected ones of the modified SRAM memory cells, while remaining modified SRAM memory cells receive the nominal supply voltage at the pull-up voltage nodes, so as to shift a value of the precharge voltage away from one-half the nominal supply voltage.

18. The device of claim 16 wherein the circuit adapted to control selective connection comprises: a control circuit adapted to selectively apply the nominal supply voltage to a pull-down voltage node of certain selected ones of the modified SRAM memory cells, while remaining modified SRAM memory cells receive the ground voltage at the pull-down voltage nodes, so as to shift a value of the precharge voltage away from one-half the nominal supply voltage.

19. The device of claim 16 wherein the circuit adapted to control generates the precharge voltage over a range of values between a first voltage value which is above one-half the nominal supply voltage and a second voltage value which is greater than said first value and less than the nominal supply voltage.

20. A memory device, comprising:
a plurality of SRAM memory cells organized in lines and in columns, each SRAM memory cell of a column being connected between two bit lines;
a circuit adapted to precharge a pair of bit lines comprising at least one precharge SRAM memory cell coupled to supply precharge to the pair of bit lines, the precharge SRAM memory cell having:
first and second output nodes connected to the pair of bit lines; and
two internal complementary latch nodes which are short-circuited together.

21. A memory device, comprising:
a plurality of SRAM memory cells organized in lines and in columns, each SRAM memory cell of a column being connected between two bit lines;
a circuit adapted to precharge the bit lines comprising:
a matrix of precharge SRAM memory cells coupled to supply precharge to the bit lines, wherein each precharge SRAM memory cell of the matrix comprises two inverters cross-connected between first and second internal nodes of the cell, said internal nodes being short-circuited together.

22. The memory device of claim 21 wherein each inverter comprises:
a first transistor connected between said internal short-circuited nodes and a first supply line of the first transistor; and
a second transistor connected between said internal short-circuited nodes and a second supply line of the second transistor;
wherein the first supply line of the first transistor being distributed along each line of the matrix and the second supply line of the second transistor being distributed along each column of the matrix.

23. A memory device of the SRAM type, comprising:
an SRAM memory array including a plurality of SRAM memory cells organized in lines and columns, each memory cell having first and second output nodes connected to two bit lines; and
a precharge voltage generator comprising:
a plurality of modified SRAM memory cells organized in a matrix, each modified SRAM memory cell having first and second output nodes connected to two bit lines and further having two internal complementary latch nodes which are short-circuited together; and
a control circuit adapted to control activation of the modified SRAM memory cells in the matrix and the generation of a precharge voltage for application to the two bit lines.

* * * * *

UNITED STATES PATENT AND TRADEMARK OFFICE
CERTIFICATE OF CORRECTION

| | | |
|---|---|---|
| PATENT NO. | : 7,755,927 B2 | Page 1 of 1 |
| APPLICATION NO. | : 11/951001 | |
| DATED | : July 13, 2010 | |
| INVENTOR(S) | : Francois Jacquet et al. | |

It is certified that error appears in the above-identified patent and that said Letters Patent is hereby corrected as shown below:

At column 7, claim number 3, line number 66, please delete the word "of" so that the line reads as follows: -- The device as claimed in claim 2, wherein the circuit --

At column 8, claim number 4, line number 4, please delete the word "of" so that the line reads as follows: -- The device as claimed in claim 2, wherein the circuit --

At column 8, claim number 5, line number 8, please delete the word "of" so that the line reads as follows: -- The device as claimed in claim 2, wherein the circuit --

Signed and Sealed this
Seventeenth Day of May, 2011

David J. Kappos
*Director of the United States Patent and Trademark Office*